(12) United States Patent
Lee et al.

(10) Patent No.: US 7,405,483 B2
(45) Date of Patent: Jul. 29, 2008

(54) ELECTRONIC ASSEMBLY AND CIRCUIT BOARD

(75) Inventors: Sheng-Yuan Lee, Taipei Hsien (TW); Hsiao-Chu Lin, Taipei Hsien (TW)

(73) Assignee: VIA Technologies, Inc., Taipei Hsien (TW)

(*) Notice: Subject to any disclaimer, the term of this patent is extended or adjusted under 35 U.S.C. 154(b) by 15 days.

(21) Appl. No.: 11/624,533

(22) Filed: Jan. 18, 2007

(65) Prior Publication Data

US 2008/0111220 A1 May 15, 2008

(30) Foreign Application Priority Data

Nov. 10, 2006 (TW) .............................. 95141633 A

(51) Int. Cl.
*H01L 23/48* (2006.01)
(52) U.S. Cl. ...................................... 257/773; 257/666
(58) Field of Classification Search ................ 257/773, 257/775, 666, 676, 784, 692
See application file for complete search history.

(56) References Cited

U.S. PATENT DOCUMENTS

| | | | |
|---|---|---|---|
| 4,849,857 A * | 7/1989 | Butt et al. ................... | 361/708 |
| 5,198,964 A * | 3/1993 | Ito et al. ..................... | 361/717 |
| 7,009,282 B2 | 3/2006 | Golick | |
| 7,019,389 B2 | 3/2006 | Lai et al. | |
| 7,211,887 B2 * | 5/2007 | Channabasappa et al. ... | 257/691 |
| 2002/0024129 A1 * | 2/2002 | Hirahara et al. ............. | 257/691 |
| 2002/0027276 A1 * | 3/2002 | Sakamoto et al. ........... | 257/690 |
| 2005/0082645 A1 * | 4/2005 | Lee et al. .................... | 257/666 |
| 2006/0043542 A1 * | 3/2006 | Corisis ....................... | 257/666 |
| 2006/0118924 A1 * | 6/2006 | Corisis et al. ............... | 257/666 |
| 2007/0228534 A1 * | 10/2007 | Uno et al. ................... | 257/678 |
| 2008/0054422 A1 * | 3/2008 | Koike et al. ................ | 257/676 |

* cited by examiner

*Primary Examiner*—S. V Clark
(74) *Attorney, Agent, or Firm*—J.C. Patents

(57) ABSTRACT

A circuit board assembled with an electronic package having a first and a second inner leads is provided. The first inner lead has a first and a second ends. The circuit board includes an insulating layer, a first pad, a second pad, an extension portion, a conductive via, and a ground layer. The first and the second pads are disposed on the insulating layer. The first end of the first inner lead is electrically connected to the second pad. The extension portion disposed on the insulating layer is electrically connected to the first pad and extends to the position under the second end of the first inner lead. The conductive via passing through the insulating layer is electrically connected to the extension portion and under the second end of the first inner lead. The ground layer disposed on the insulating layer is electrically connected to the conductive via.

20 Claims, 2 Drawing Sheets

ELECTRONIC ASSEMBLY AND CIRCUIT BOARD

CROSS-REFERENCE TO RELATED APPLICATION

This application claims the priority benefit of Taiwan application serial no. 95141633, filed Nov. 10, 2006. All disclosure of the Taiwan application is incorporated herein by reference.

BACKGROUND OF THE INVENTION

1. Field of the Invention

The present invention relates to an electronic assembly and a circuit board. More particularly, the present invention relates to an electronic assembly having an electronic package and a circuit board and a circuit board assembled with an electronic package.

2. Description of Related Art

Generally speaking, a conventional circuit board for carrying and electrically connecting a plurality of electronic components is mainly composed of a plurality of patterned conductive layers and a plurality of insulating layers which are stacked alternately, wherein the patterned conductive layers are made of, for example, cooper foil defined by a lithography and etching process, and the insulating layers are respectively disposed between the adjacent patterned conductive layers to isolate them from one another. Furthermore, the stacked patterned conductive layers are electrically connected through conductive vias. Additionally, a chip package is disposed on the surface of the circuit board to form an electronic assembly. The chip package is electrically connected to the patterned conductive layer on the surface of the circuit board, and achieves the purpose of electrical signal propagation through the circuits within the circuit board.

However, when the conventional electronic assembly operates, a crosstalk phenomenon is generated inside the electronic assembly, thereby degrading the quality of signal transmission. In view of the above, how to reduce the crosstalk generated as the electronic assembly operates to enhance the quality of signal transmission becomes an issue to be solved urgently.

SUMMARY OF THE INVENTION

The present invention is directed to an electronic assembly with better electrical signal propagation quality.

The present invention is directed to a circuit board assembled with an electronic package and having better electrical signal propagation quality.

The electronic assembly provided by the present invention includes an electronic package and a circuit board. The electronic package includes a lead frame having a chip pad and a plurality of inner leads, wherein the chip pad is used for carrying a chip, and the chip pad and at least a portion of the inner leads are electrically connected to a plurality of bonding pads on the chip. The electronic package is disposed on the circuit board having an insulating layer and a patterned conductive layer. The patterned conductive layer is disposed on the insulating layer and includes a first pad, an extension portion, and at least one second pad. The chip pad is disposed on and electrically connected to the first pad. The extension portion is electrically connected to the first pad. The second pad is electrically connected to a first end of one of the inner leads. Additionally, a first orthogonal projection of a second end of the inner lead electrically connected to the second pad is formed on the insulating layer and at least overlaps with a second orthogonal projection of the extension portion formed on the insulating layer.

The electronic assembly provided by the present invention includes an electronic package and a circuit board. The electronic package includes a lead frame having a chip pad and a plurality of inner leads, wherein the chip pad is used for carrying a chip, and the chip pad and at least a portion of the inner leads are electrically connected to a plurality of bonding pads on the chip. The electronic package is disposed on the circuit board having an insulating layer and a patterned conductive layer. The patterned conductive layer is disposed on the insulating layer and includes a first pad, an extension portion, and at least one second pad. The chip pad is disposed on and electrically connected to the first pad. The extension portion is electrically connected to the first pad. The second pad is electrically connected to a first end of one of the inner leads. Additionally, the extension portion extends to the position under a second end of the inner lead electrically connected to the second pad.

The present invention provides a circuit board assembled with an electronic package, wherein the electronic package has a first inner lead and a second inner lead. The first inner lead includes a first end and a second end, and the circuit board includes an insulating layer, a first pad, a second pad, an extension portion, a conductive via, and a ground layer. The first pad is disposed on the insulating layer and the second pad is disposed on the insulating layer, wherein a first end of the first inner lead is electrically connected to the second pad. The extension portion disposed on the insulating layer is electrically connected to the first pad and extends to under a second end of the first inner lead. The conductive via passing through the insulating layer is electrically connected to the extension portion and under the second end of the first inner lead. The ground layer is disposed on the insulating layer and electrically connected to the conductive via.

In order to the make aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
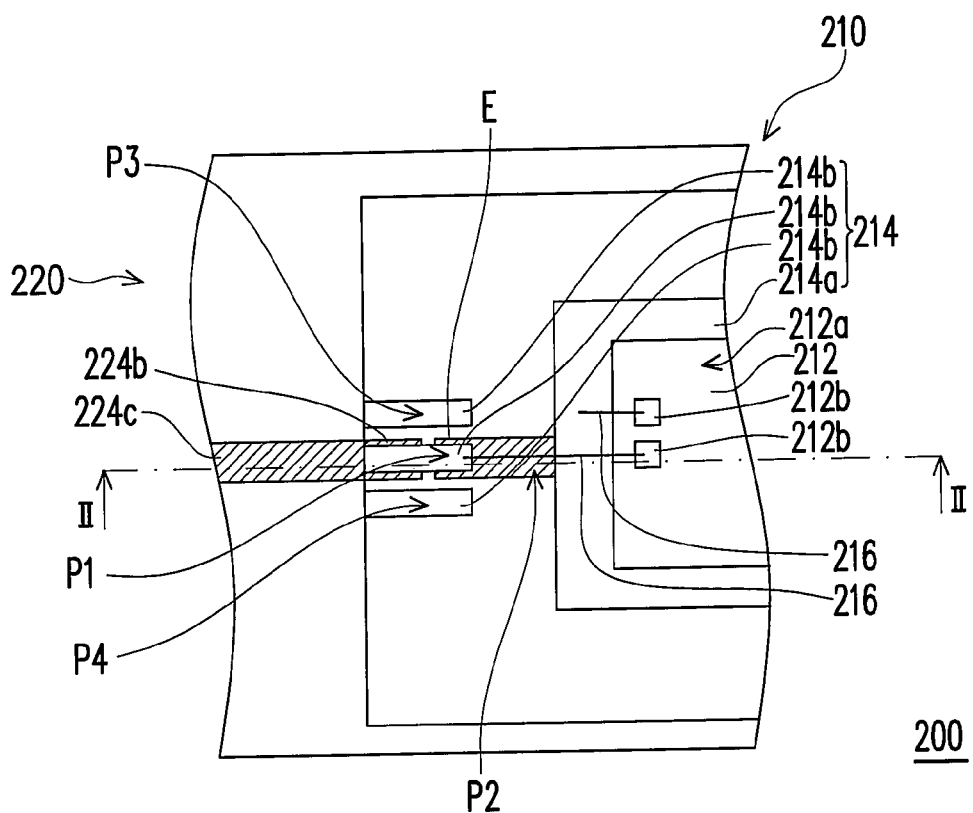
FIG. 1A is a schematic top view of an electronic assembly according to a first embodiment of the present invention.
Figure 1B:
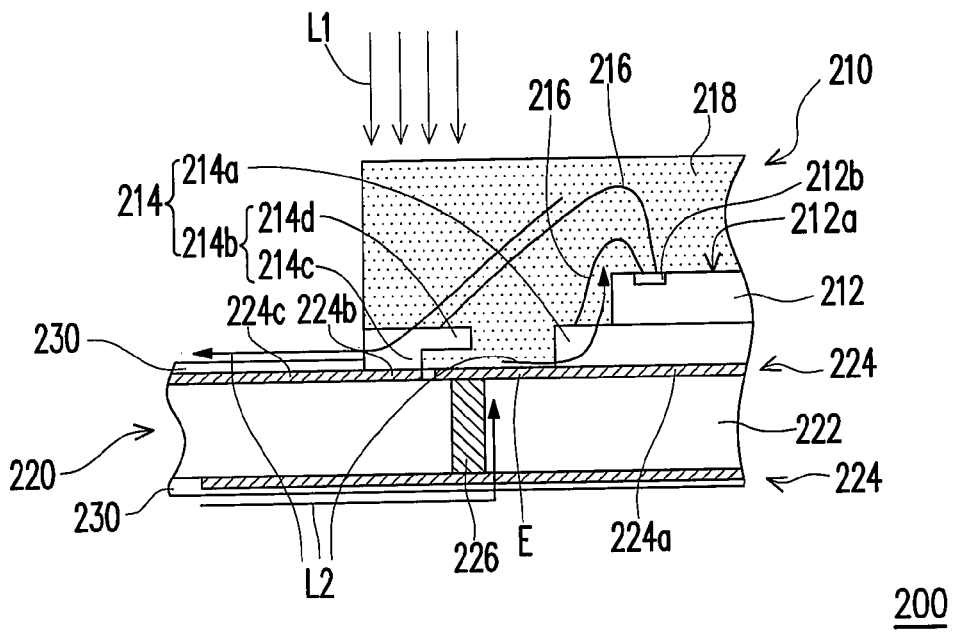
FIG. 1B is a schematic sectional view of the electronic assembly in FIG. 1A taken along Line II-II.

FIG. 1A is a schematic top view of an electronic assembly according to a first embodiment of the present invention, and FIG. 1B is a schematic sectional view of the electronic assembly in FIG. 1A taken along Line II-II. Referring to FIGS. 1A and 1B, the electronic assembly 200 in this embodiment includes an electronic package 210 and a circuit board 220, wherein the electronic package 210 is disposed on the circuit board 220. The electronic package 210 is for example, a quad flat no-lead (QFN) chip package.

The electronic package 210 includes a chip 212 and a lead frame 214. The chip 212 includes an active surface 212a and a plurality of bonding pads 212b disposed on the active surface 212a (only two bonding pads 212b are exemplarily shown in FIG. 1A). The lead frame 214 includes a chip pad 214a and a plurality of inner leads 214b (only three inner leads 214b are exemplarily shown in FIG. 1A). It should be noted that in order to facilitate the following illustration, if the three inner leads 214b should be indicated and described respectively in the specification according to relative positions shown in FIG. 1A, the three inner leads 214b from top to bottom are sequentially named as a first inner lead 214b, a second inner lead 214b, and a third inner lead 214b.

The chip 212 is disposed on the chip pad 214a, and the active surface 212a is disposed at a distance from the chip pad 214a. In other words, according to the relative positions shown in FIG. 1B, the active surface 212a of the chip 212 is disposed on the top. In addition, the chip pad 214a and at least a portion of the inner leads 214b are electrically connected to the bonding pads 212b.

Referring to FIG. 1B, the circuit board 220 includes an insulating layer 222, at least one patterned conductive layer 224 (only two are exemplarily shown in FIG. 1B), and a conductive via 226. The patterned conductive layers 224 are disposed on two opposite sides of the insulating layer 222. The patterned conductive layer 224 (hereinafter "the upper patterned conductive layer 224") that is in direct contact with the electronic package 210 includes a pad 224a, an extension portion E, and at least one pad 224b (only one is exemplarily shown in FIG. 1A). The pad 224a is, for example, a ground pad, and the pad 224b is, for example, a signal pad. Furthermore, the electronic assembly 200 in the first embodiment further includes two solder mask layers 230 disposed on the patterned conductive layers 224 respectively, and the solder mask layer 230 disposed on the upper patterned conductive layer 224 exposes the pads 224a and 224b. The function of the solder mask layers 230 is to protect the patterned conductive layers 224.

It should be noted that in the embodiment of the present invention, the conductive via 226 is electrically connected to the patterned conductive layer 224 (hereinafter "the lower patterned conductive layer 224") disposed far away from the electronic package 210, wherein the lower patterned conductive layer 224 is a ground layer.

Referring to FIGS. 1A and 1B, the chip pad 214a is disposed on and electrically connected to the pad 224a, and the pad 224a is electrically connected to an extension portion E. The pad 224b is electrically connected to an end 214c of the second inner lead 214b. The orthogonal projection P1 of the other end 214d of the second inner lead 214b is formed on the insulating layer 222, and the orthogonal projection P1 at least overlaps with the orthogonal projection P2 of the extension portion E formed on the insulating layer. The so-called orthogonal projection is explained as follows. When the parallel beam is irradiated on an object, the shadow of the object will be projected onto a surface perpendicular to a parallel beam. Herein, according to the definition of the orthogonal projection, the orthogonal projection P1 is a shadow of an end 214d of the second inner lead 214b projected onto the insulating layer 222 when a parallel beam L1 is irradiated onto the end 214d of the second inner lead 214b from the above. The above definition of the orthogonal projection is also suitable for the orthogonal projection P2 and other orthogonal projections below. In other words, according to the relative position in FIG. 1B, the extension portion E extends to the position under the other end 214d of the second inner lead 214b electrically connected to the pad 224b. Furthermore, the conductive via 226 passing through the insulating layer 222 is electrically connected to the extension portion E and under the second inner lead 214b.

In the embodiment of the present invention, when the extension portion E extends to the position under the second inner lead 214b electrically connected to the pad 224b, the extension portion E does not expand to the position under other first inner lead 214b or third inner lead adjacent to the second inner lead 214b. In other words, the orthogonal projection P3 of the first inner lead 214b and the orthogonal projection P4 of the third inner lead 214b on the insulating layer 222 do not overlap with the orthogonal projection P2 of the extension portion E on the insulating layer 222. That is to say, a space exists between the orthogonal projection P3 of the first inner lead 214b and the orthogonal projection P2 of the extension portion E, and a space exists between the orthogonal projection P4 of the third inner lead 214b and the orthogonal projection P2 of the extension portion E.

It should be noted that referring to FIGS. 1A and 1B, in some embodiments, the patterned conductive layer 224 of the circuit board 220 includes a pad 224a, an extension portion E, and at least one pad 224b (only one as shown in FIG. 1A). The extension portion E is electrically connected to the pad 224a. And if the pad 224a is a ground pad, the extension portion E is also grounded. Furthermore, the extension portion E extends to the position under an end 214d of the second inner lead 214b. That is to say, the orthogonal projection of the second inner lead 214b on the upper patterned conductive layer 224 at least overlaps with the extension portion E. Furthermore, the extension portion E does not expand to the position under the other inner leads 214b adjacent to the second inner lead 214b. In other words, the orthogonal projections of the other inner leads 214b adjacent to the second inner lead 214b on the upper patterned conductive layer 224 do not overlap with the extension portion E. That is, spaces exist between the orthogonal projections of the other inner leads 214b adjacent to the second inner lead 214b and the extension portion E.

In the first embodiment, the patterned conductive layers 224 are disposed on two outer sides of the insulating layer 222, respectively. The patterned conductive layers 224 are made of, for example, copper foil defined by a lithography process or/and an etching process. And the material of the insulating layer 222 is, for example, FR-4 or epoxy resin.

It should be noted that in the first embodiment, there are two patterned conductive layers 224 and one insulating layer 222, but the circuit board 220 may be another multilayered structure. For example, a plurality of patterned conductive layers 224 and a plurality of insulating layers 222 are stacked alternately to form a multilayered structure. The insulating layers 222 may be disposed between adjacent patterned conductive layers 224, so as to isolate the patterned conductive layers 224 from one another. Besides, the stacked patterned conductive layers 224 are electrically connected through at least one conductive via. Accordingly, the circuit board 220 in the first embodiment is merely an example and not intended to limit the present invention.

The upper patterned conductive layer 224 in the first embodiment includes at least one transmission line 224c (only one is exemplarily shown in FIG. 1A). And the electronic package 210 further includes a plurality of bonding wires 216 (only two are exemplarily shown in FIG. 1A) and an encapsulant 218. The pad 224b of the upper patterned conductive layer 224 is electrically connected to the transmission line 224c and one of the inner leads 214b (i.e., the second inner lead 214b). Additionally, the chip pad 214a and at least a portion of the inner leads 214b are electrically connected to the bonding pads 212b through the bonding wires 216.

In detail, the second inner leads 214b electrically connected to the pad 224b are electrically connected to one of the bonding pads 212b through one of the bonding wires 216. Additionally, the bonding pads 212b (i.e., the bonding pad 212b in the upper part of FIG. 1A), adjacent to the bonding pad 212b (i.e., the bonding pad 212b in the lower part of FIG. 1A) electrically connected to the pad 224b, are electrically connected to the chip pad 214a through one of the bonding wires 216.

The encapsulant 218 at least encapsulates the chip 212, the bonding wires 216, and a portion of the lead frame 214. The function of the encapsulant 218 is to protect the bonding wires 216 from being adversely affected by the ambient moisture and temperature.

According to the relative positions in FIG. 1B, when the electronic assembly 200 operates, a loop L2 for transmitting an electrical signal is formed inside the electronic assembly 200. In detail, the chip 212 transmits an electrical signal to another electronic component (not shown) through one of the bonding pads 212b (i.e., the bonding pad 212b in the lower part of FIG. 1A), one of the bonding wires 216 (i.e., the longer one in FIGS. 1A and 1B), one of the inner leads 214b (i.e., the second inner lead 214b), the pad 224b, and the transmission line 224c which are electrically connected in sequence. Next, the electronic component transmits another electrical signal (a ground signal) to another bonding pad 212b (i.e., the bonding pad 212b in the upper part of FIG. 1A) through the lower patterned conductive layer 224 (the ground layer), the conductive via 226, the extension portion E, the pad 224a, the chip pad 214a, and another bonding wire 216 (i.e., the shorter one in FIGS. 1A and 1B) which are electrically connected in sequence. The loop L2 for transmitting the electrical signals surrounds a small range. Therefore, the phenomenon that the loop L2 and other loops (not shown) for transmitting the electrical signals generate inductive coupling and capacitive coupling is alleviated, thereby reducing the crosstalk between the loop L2 and other loops and enhancing the electrical signal transmission quality of the loop L2.

Generally speaking, when the electronic assembly 200 operates, a signal current is output from the chip 212. Next, a return current flows back to the pad 224a and then to the chip 212 through the lower patterned conductive layer 224 (the ground layer) and the conductive via 226. According to an embodiment of the present invention, since the extension portion E is under the second inner lead 214b, the path of the return current flowing through the ground layer is reduced, thereby alleviating the crosstalk between the loops in the electronic assembly 200.

Figure 2A:
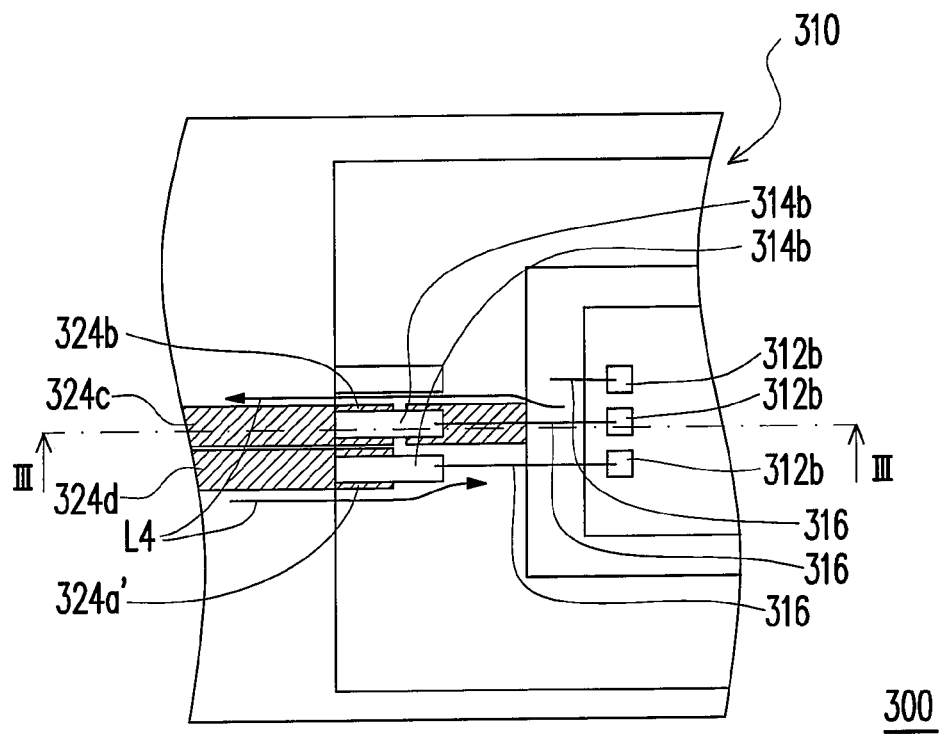
FIG. 2A is a schematic top view of an electronic assembly according to a second embodiment of the present invention.
Figure 2B:
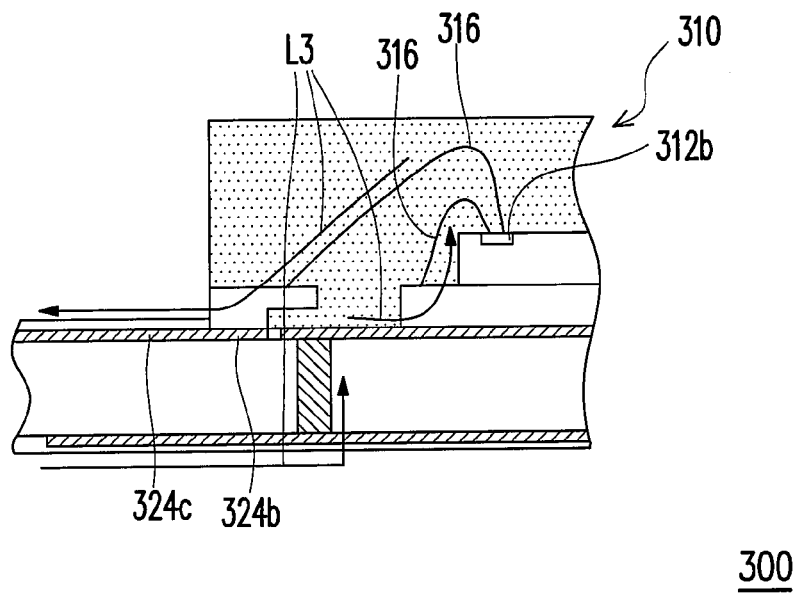
FIG. 2B is a schematic sectional view of the electronic assembly in FIG. 2A taken along Line III-III.

FIG. 2A is a schematic top view of an electronic assembly according to a second embodiment of the present invention. And FIG. 2B is a schematic sectional view of the electronic assembly in FIG. 2A taken along Line III-III. Referring to FIGS. 2A and 2B, the electronic assembly 300 in the second embodiment is mainly different from the electronic assembly 200 in the first embodiment in terms of the connection manner of the bonding wires 316 of an electronic package 310 in the second embodiment.

When the electronic assembly 300 in the second embodiment operates, a loop L3 and a loop L4 transmitting electrical signals in two directions are formed in the electronic assembly 300. The transmission mode of the loop L3 is similar to the transmission mode of the loop L2 in the second embodiment and will not be described herein again. The transmission direction of a loop L4 is illustrated as follows. The chip 212 transmits an electrical signal to another electronic component (not shown) through one of the bonding pads 312b (i.e., the bonding pad 312b in the middle part of FIG. 2A), one of the bonding wires 316 (i.e., the bonding wire 316 in the middle part of FIG. 2A, and the longer one of the bonding wires 316 in FIG. 2B), one of the inner leads 314b (i.e., the inner lead 314b in the middle part of FIG. 2A), the pad 324b (such as a signal pad), and a transmission line 324c which are electrically connected in sequence. Then, the electronic component transmits another electrical signal (the ground signal) to another bonding pad 312b (i.e., the bonding pad 312b in the lower part of FIG. 2A) through other transmission lines 324d (such as ground transmission lines) of the upper patterned conductive layer 324, another pad 324a' (such as the ground pad), one of the inner leads 314b (i.e., the inner lead 314b in the lower part of FIG. 2A), and another bonding wire 316 (i.e., the bonding wire 316 in the lower part of FIG. 2A) which are electrically connected in sequence.

The route surfaces formed by the loops L3 and L4 are nearly perpendicular to each other. And the crosstalk between the loops L3 and L4 are alleviated, thereby enhancing the electrical signal transmission quality of the loops L3 and L4.

In view of the above, the electronic assembly and the circuit board provided by the present invention includes at least the following advantages.

1. Since the loop for transmitting the electrical signals disposed in the electronic assembly of the present invention has a small surrounding ranges, the phenomenon that the loop and other loops for transmitting the electrical signals generate inductive coupling and capacitive coupling is alleviated, thereby reducing the crosstalk between the loop having a small surrounding range and the other loops and enhancing the electrical signal transmission quality of the loop having a small surrounding range.

2. Since the extension portion of the circuit board of the electronic assembly of the present invention and the conductive via electrically connected to the extension portion may be formed through an existing method of manufacturing a circuit board, a designer need not change the architecture of a conventional lead frame, and the manufacturing cost of the electronic assembly of the present invention can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic assembly, comprising:
an electronic package, comprising a lead frame, having a chip pad and a plurality of inner leads, wherein the chip pad is used for carrying a chip and the chip pad and at least a portion of the inner leads are electrically connected to a plurality of bonding pads on the chip; and
a circuit board, wherein the electronic package is disposed on the circuit board and the circuit board comprises an insulating layer, a patterned conductive layer disposed on a side of the insulating layer, a conductive via passing through the insulating layer, and a ground layer disposed on an opposite side of the insulating layer, wherein the patterned conductive layer comprises:
a first pad, wherein the chip pad is disposed on the first pad and electrically connected to the first pad;
an extension portion, electrically connected to the first pad; and
at least one second pad, electrically connected to a first end of one of the inner leads;
wherein the conductive via is electrically connected to the extension portion and disposed under one of the inner leads and the ground layer is electrically connected to the conductive via;
wherein a first orthogonal projection of a second end of the inner lead electrically connected to the second pad is formed on the insulating layer, and the first orthogonal projection at least overlaps with a second orthogonal projection of the extension portion formed on the insulating layer.

2. The electronic assembly as claimed in claim 1, wherein an adjacent inner lead is disposed beside the inner lead above the extension portion, and a third orthogonal projection of the adjacent inner lead formed on the insulating layer does not overlap with the second orthogonal projection of the extension portion formed on the insulating layer.

3. The electronic assembly as claimed in claim 1, wherein the electronic package further comprises a chip disposed on the chip pad, wherein the chip has an active surface and a plurality of bonding pads on the active surface, the active surface is disposed at a distance from the chip pad, and the chip pad and at least a portion of the inner leads are electrically connected to the bonding pads.

4. The electronic assembly as claimed in claim 1, wherein the first pad is a ground pad and the second pad is a signal pad.

5. The electronic assembly as claimed in claim 1, wherein the electronic package further comprises a plurality of bonding wires, and the chip pad and at least a portion of the inner leads are electrically connected to the bonding pads via the bonding wires.

6. The electronic assembly as claimed in claim 5, wherein one of the inner leads electrically connected to the second pad is electrically connected to one of the bonding pads through one of the bonding wires.

7. The electronic assembly as claimed in claim 6, wherein one of the other bonding pads adjacent to the bonding pad electrically connected to the second pad is electrically connected to the chip pad via one of the bonding wires.

8. The electronic assembly as claimed in claim 5, wherein the electronic package further comprises an encapsulant which at least encapsulates the chip, the bonding wires, and a portion of the lead frame.

9. The electronic assembly as claimed in claim 1, further comprising a solder mask layer disposed on the patterned conductive layer and exposing the first pad and the second pad.

10. An electronic assembly, comprising:
an electronic package, comprising a lead frame, having a chip pad and a plurality of inner leads, wherein the chip pad is used for carrying a chip, and the chip pad and at least a portion of the inner leads are electrically connected to a plurality of bonding pads on the chip; and
a circuit board, wherein the electronic package is disposed on the circuit board and the circuit board comprises:
an insulating layer;
a patterned conductive layer, disposed on the insulating layer, comprising:
a first pad, wherein the chip pad is disposed on the first pad and electrically connected to the first pad;
an extension portion, electrically connected to the first pad; and
at least one second pad, electrically connected to a first end of one of the first inner leads;
wherein the extension portion extends to the position under a second end of the inner lead electrically connected to the second pad.

11. The electronic assembly as claimed in claim 10, wherein an adjacent inner lead is disposed beside the inner lead corresponding to the extension portion, and the extension portion does not extend to the position under the adjacent inner lead.

12. The electronic assembly as claimed in claim 10, wherein the electronic package further comprises a chip disposed on the chip pad, wherein the chip comprises an active surface and a plurality of bonding pads disposed on the active surface, the active surface is disposed at a distance from the chip pad, and the chip pad and at least a portion of the inner leads are electrically connected to the bonding pads.

13. The electronic assembly as claimed in claim 10, wherein the circuit board further comprises:
a conductive via, passing through the insulating layer and electrically connected to the extension portion, wherein the conductive via is disposed under one of the inner leads; and
a ground layer, disposed on the insulating layer and electrically connected to the conductive via.

14. The electronic assembly as claimed in claim 10, wherein the first pad is a ground pad and the second pad is a signal pad.

15. The electronic assembly as claimed in claim 10, wherein the electronic package further comprises a plurality of bonding wires, and the chip pad and at least a portion of the inner leads are electrically connected to the bonding pads via the bonding wires.

16. The electronic assembly as claimed in claim 15, wherein one of the inner leads electrically connected to the second pad is electrically connected to one of the bonding pads thorough one of the bonding wires.

17. The electronic assembly as claimed in claim 16, wherein one of the other bonding pads adjacent to the bonding pad electrically connected to the second pad is electrically connected to the chip pad via one of the bonding wires.

18. The electronic assembly as claimed in claim 15, wherein the electronic package further comprises an encapsulant, which at least encapsulates the chip, the bonding wires, and a portion of the lead frame.

19. The electronic assembly as claimed in claim 10, further comprising a solder mask layer disposed on the patterned conductive layer and exposing the first pad and the second pad.

20. A circuit board assembled with an electronic package, wherein the electronic package comprises a first inner lead and a second inner lead and the first inner lead comprises a first end and a second end, comprising:
an insulating layer;
a first pad, disposed on the insulating layer;
a second pad, disposed on the insulating layer, wherein the first end of the first inner lead is electrically connected to the second pad;
an extension portion, disposed on the insulating layer and electrically connected to the first pad, wherein the extension portion extends to the position under the second end of the first inner lead;

a conductive via, passing through the insulating layer and electrically connected to the extension portion, wherein the conductive via is disposed under the second end of the first inner lead; and a ground layer, disposed on the insulating layer, wherein the conductive via is electrically connected to the ground layer;

wherein the first pad is a ground pad and the second pad is a signal pad.

* * * * *